(12) United States Patent
Westerlaken et al.

(10) Patent No.: US 10,788,763 B2
(45) Date of Patent: Sep. 29, 2020

(54) LITHOGRAPHIC APPARATUS

(71) Applicants: ASML NETHERLANDS B.V., Veldhoven (NL); ASML HOLDING N.V., Veldhoven (NL)

(72) Inventors: Jan Steven Christiaan Westerlaken, Heesch (NL); Ruud Hendrikus Martinus Johannes Bloks, Helmond (NL); Peter A. Delmastro, New Milford, CT (US); Thibault Simon Mathieu Laurent, Eindhoven (NL); Martinus Hendrikus Antonius Leenders, Rhoon (NL); Mark Josef Schuster, Fairfield, CT (US); Christopher Charles Ward, Somerville, MA (US); Frank Johannes Jacobus Van Boxtel, Eindhoven (NL); Justin Matthew Verdirame, Cambridge, MA (US); Samir A. Nayfeh, Shrewsbury, MA (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 0 days.

(21) Appl. No.: 15/354,821

(22) Filed: Nov. 17, 2016

(65) Prior Publication Data
US 2017/0068175 A1    Mar. 9, 2017

Related U.S. Application Data

(63) Continuation of application No. 14/411,870, filed as application No. PCT/EP2013/061560 on Jun. 5, 2013, now Pat. No. 9,513,568.
(Continued)

(51) Int. Cl.
*G03B 27/52* (2006.01)
*G03F 7/20* (2006.01)

(52) U.S. Cl.
CPC ...... *G03F 7/70875* (2013.01); *G03F 7/70916* (2013.01); *G03F 7/70933* (2013.01)

(58) Field of Classification Search
CPC ............. G03F 7/70858; G03F 7/70866; G03F 7/70875; G03F 7/70916; G03F 7/70925;
(Continued)

(56) References Cited

U.S. PATENT DOCUMENTS 6,153,044 A    11/2000    Klebanoff et al.
6,153,877 A    11/2000    Ashida
(Continued)

FOREIGN PATENT DOCUMENTS

CN         1989452      6/2007
CN       101009213      8/2007
(Continued)

OTHER PUBLICATIONS

English translation of JP 2011-249620, published Dec. 8, 2011. (Year: 2011).*
Notice of Reasons for Rejection issued in corresponding Japanese Patent Application No. 2016-199812 dated Oct. 4, 2017.
Bert Dirk Scholten et al., U.S. Appl. No. 61/637,729, filed Apr. 24, 2012.
(Continued)

*Primary Examiner* — Christina A Riddle
(74) *Attorney, Agent, or Firm* — Pillsbury Winthrop Shaw Pittman, LLP

(57) ABSTRACT

A lithographic apparatus has a support structure configured to support a patterning device, the patterning device serving to pattern a radiation beam according to a desired pattern and having a planar main surface through which the radiation beam passes; an outlet opening configured to direct a flow of a gas onto the patterning device; and an inlet opening configured to extract the gas which has exited the outlet opening, wherein the outlet opening and inlet opening are in
(Continued)

a facing surface facing the planar main surface of the patterning device.

20 Claims, 10 Drawing Sheets

Related U.S. Application Data

(60) Provisional application No. 61/761,560, filed on Feb. 6, 2013, provisional application No. 61/668,934, filed on Jul. 6, 2012.

(58) Field of Classification Search
CPC ............ G03F 7/70933; G03F 7/70808; G03F 7/70841; G03F 7/70908; G03F 7/7085
USPC ............... 355/30, 52, 53, 55, 67–71, 75–77; 250/492.1, 492.2, 492.22, 493.1, 548; 430/5, 8, 22, 30, 311, 312, 321
See application file for complete search history.

(56) References Cited

U.S. PATENT DOCUMENTS

| | | | |
|---|---|---|---|
| 6,253,464 B1 | 7/2001 | Klebanoff et al. | |
| 6,406,545 B2 | 6/2002 | Shoda et al. | |
| 6,542,220 B1 * | 4/2003 | Schrijver | G03F 7/70716 355/53 |
| 6,555,834 B1 | 4/2003 | Loopstra | |
| 6,610,123 B2 | 8/2003 | Wu et al. | |
| 6,642,996 B2 | 11/2003 | Nogawa | |
| 6,757,048 B2 | 6/2004 | Arakawa | |
| 6,793,717 B2 | 9/2004 | Wu et al. | |
| 6,801,301 B2 | 10/2004 | Miyajima et al. | |
| 6,891,593 B2 | 5/2005 | Arakawa | |
| 7,030,959 B2 | 4/2006 | Sogard | |
| 7,034,478 B2 | 4/2006 | Arakawa | |
| 7,057,701 B2 | 6/2006 | Chibana et al. | |
| 7,057,702 B2 | 6/2006 | Lof et al. | |
| 7,202,934 B2 | 4/2007 | Moors et al. | |
| 7,367,138 B2 | 5/2008 | Sogard | |
| 7,381,502 B2 | 6/2008 | Berman et al. | |
| 7,423,724 B2 | 9/2008 | Hasegawa et al. | |
| 7,532,310 B2 | 5/2009 | Mertens et al. | |
| 7,554,648 B2 | 6/2009 | Sogard | |
| 7,619,718 B2 | 11/2009 | Luo et al. | |
| 7,745,079 B2 | 6/2010 | Coon | |
| 7,797,855 B2 | 9/2010 | Fukuoka et al. | |
| 7,875,864 B2 | 1/2011 | Sogard | |
| 7,877,895 B2 | 2/2011 | Otsuka et al. | |
| 7,980,003 B2 | 7/2011 | Aoki et al. | |
| 7,992,318 B2 | 8/2011 | Kawaji et al. | |
| 8,184,265 B2 | 5/2012 | Wardenier | |
| 8,675,169 B2 | 3/2014 | Van Boxtel et al. | |
| 2001/0008172 A1 | 7/2001 | Shoda et al. | |
| 2001/0038442 A1 | 11/2001 | Hansell et al. | |
| 2002/0018190 A1 | 2/2002 | Nogawa et al. | |
| 2002/0057422 A1 | 5/2002 | Arakawa | |
| 2002/0057423 A1 | 5/2002 | Nogawa | |
| 2002/0083957 A1 | 7/2002 | Reid | |
| 2002/0145711 A1 | 10/2002 | Magome et al. | |
| 2002/0191163 A1 | 12/2002 | Hasegawa et al. | |
| 2003/0006380 A1 | 1/2003 | Van Empel et al. | |
| 2003/0025889 A1 * | 2/2003 | Hasegawa | G03B 27/52 355/30 |
| 2003/0071982 A1 | 4/2003 | Miyajima et al. | |
| 2003/0110944 A1 | 6/2003 | Wu et al. | |
| 2003/0169407 A1 * | 9/2003 | Hasegawa | G03F 7/70883 355/30 |
| 2004/0017551 A1 | 1/2004 | Arakawa | |
| 2004/0045433 A1 | 3/2004 | Wu et al. | |
| 2005/0030496 A1 | 2/2005 | Chibana et al. | |
| 2005/0053851 A1 | 3/2005 | Berman et al. | |
| 2005/0074352 A1 | 4/2005 | Luo et al. | |
| 2005/0146696 A1 | 7/2005 | Arakawa | |
| 2005/0286032 A1 | 12/2005 | Lof et al. | |
| 2006/0012762 A1 | 1/2006 | Hsieh et al. | |
| 2006/0017895 A1 | 1/2006 | Sogard | |
| 2006/0102849 A1 | 5/2006 | Mertens et al. | |
| 2006/0131682 A1 | 6/2006 | Moors et al. | |
| 2006/0215137 A1 | 9/2006 | Hasegawa et al. | |
| 2007/0079525 A1 | 4/2007 | Sogard | |
| 2007/0103656 A1 | 5/2007 | Sogard | |
| 2007/0121091 A1 | 5/2007 | Sogard | |
| 2007/0169373 A1 | 7/2007 | Aoki et al. | |
| 2007/0209226 A1 | 9/2007 | Coon | |
| 2007/0285632 A1 | 12/2007 | Phillips et al. | |
| 2008/0173339 A1 | 7/2008 | Hsieh et al. | |
| 2008/0184584 A1 | 8/2008 | Sogard | |
| 2009/0207394 A1 * | 8/2009 | Shibazaki | G03F 7/707 355/53 |
| 2009/0323039 A1 | 12/2009 | Wardenier | |
| 2010/0073661 A1 | 3/2010 | Shibazaki et al. | |
| 2010/0183987 A1 | 7/2010 | Yonekawa | |
| 2010/0195074 A1 | 8/2010 | Sogard | |
| 2011/0032495 A1 | 2/2011 | Shibazaki | |
| 2011/0032496 A1 | 2/2011 | Shibazaki | |
| 2011/0236845 A1 | 9/2011 | Aoki et al. | |
| 2011/0279799 A1 | 11/2011 | Singer et al. | |
| 2012/0026474 A1 | 2/2012 | Nayfeh | |
| 2012/0092631 A1 | 4/2012 | Van Boxtel et al. | |
| 2013/0038854 A1 | 2/2013 | Kunnen et al. | |

FOREIGN PATENT DOCUMENTS

| | | |
|---|---|---|
| CN | 100565789 | 12/2009 |
| CN | 102187281 | 9/2011 |
| DE | 102009045008 | 4/2010 |
| EP | 1 030 351 | 8/2000 |
| EP | 1 207 425 | 5/2002 |
| EP | 1 326 139 | 7/2003 |
| EP | 1 610 183 | 12/2005 |
| EP | 1 731 967 | 12/2006 |
| EP | 1 771 770 | 4/2007 |
| EP | 2 102 711 | 9/2009 |
| JP | H04-192317 | 7/1992 |
| JP | 9-275070 A | 10/1997 |
| JP | H10-022196 | 1/1998 |
| JP | H10-135120 | 5/1998 |
| JP | H10-289874 | 10/1998 |
| JP | H11-031647 | 2/1999 |
| JP | 2001-093796 | 4/2001 |
| JP | 2001-093797 | 4/2001 |
| JP | 2001118783 | 4/2001 |
| JP | 2001-168027 A | 8/2001 |
| JP | 2001-210587 A | 8/2001 |
| JP | 2001-358056 A | 12/2001 |
| JP | 2002-151400 | 5/2002 |
| JP | 2002-373855 A | 12/2002 |
| JP | 2003-234281 | 8/2003 |
| JP | 2003-257845 A | 9/2003 |
| JP | 2003-532304 | 10/2003 |
| JP | 2004-519012 | 6/2004 |
| JP | 2004179570 | 6/2004 |
| JP | 2004-214552 A | 7/2004 |
| JP | 2004-266051 | 9/2004 |
| JP | 2005-136263 A | 5/2005 |
| JP | 2005-322725 A | 11/2005 |
| JP | 2006-013502 | 1/2006 |
| JP | 2007-201037 | 8/2007 |
| JP | 2008-507848 | 3/2008 |
| JP | 2008/166614 | 7/2008 |
| JP | 2008-2704410 A | 11/2008 |
| JP | 4289906 | 7/2009 |
| JP | 2010-501999 | 1/2010 |
| JP | 2010-182942 | 8/2010 |
| JP | 4527670 | 8/2010 |
| JP | 2011-219902 | 11/2011 |
| JP | 2011-249620 | 12/2011 |
| JP | 2011249620 A * | 12/2011 |
| JP | 2012-028531 | 2/2012 |
| JP | 2012-506134 | 3/2012 |
| KR | 20010031972 | 4/2001 |
| KR | 20020037709 | 5/2002 |

(56) References Cited

FOREIGN PATENT DOCUMENTS

| | | |
|---|---|---|
| KR | 10-0453343 | 10/2004 |
| KR | 1020070035582 | 3/2007 |
| KR | 1020070078073 | 7/2007 |
| KR | 1020090081029 | 7/2009 |
| KR | 1020110069083 | 6/2011 |
| MM | 2002-260998 | 9/2002 |
| TW | 444270 | 7/2001 |
| TW | I249781 | 2/2006 |
| TW | 200741159 | 11/2007 |
| TW | I320088 | 2/2010 |
| WO | 99/25010 | 5/1999 |
| WO | 99/57607 | 11/1999 |
| WO | 00/030163 | 5/2000 |
| WO | 2006/012462 | 2/2006 |
| WO | 2008/072641 | 6/2008 |
| WO | 2009/078422 A1 | 6/2009 |
| WO | 2009/125867 | 10/2009 |
| WO | 2010/043398 | 4/2010 |
| WO | 2011/016254 | 2/2011 |
| WO | 2011/016255 | 2/2011 |
| WO | 2011/062296 | 5/2011 |
| WO | 2011/062297 | 5/2011 |

OTHER PUBLICATIONS

International Search Report and Written Opinion dated Dec. 9, 2013 in corresponding International Patent Application No. PCT/EP2013/061560.

International Preliminary Report on Patentability dated Jan. 15, 2015 in corresponding International Patent Application No. PCT/EP2013/061560.

Japanese Office Action dated Nov. 19, 2015 in corresponding Japanese Patent Application No. 2015-518939.

Yohei Fujishima et al., "Comprehensive thermal aberration & distortion control of lithographic lenses for accurate overlay," Proc. of SPIE, vol. 8683, pp. 86831I-1-86831I-7 (2013).

Yuji Shiba et al., "High Overlay Accuracy for Double Patterning Using an Immersion Scanner," Proc. of SPIE, vol. 8326, pp. 83260T-1-83260T-11 (Feb. 21, 2012).

Yusaku Uehara et al., "Immersion and Dry ArF Scanners Enabling 22nm HP Production and Beyond," Proc. of SPIE, vol. 8326, pp. 83261H-1-83261H-12 (Feb. 21, 2012).

Japanese Office Action issued in corresponding Japanese Patent Application No. 2018-101955, dated Mar. 18, 2019.

Office Action dated Jul. 31, 2020 issued in corresponding Japanese Patent Application No. 2019-154221 with English translation.

\* cited by examiner

LITHOGRAPHIC APPARATUS

CROSS-REFERENCE TO RELATED APPLICATIONS

This application is a continuation of U.S. patent application Ser. No. 14/411,870, which was filed on Dec. 29, 2014, now allowed, which is the U.S. national phase entry of PCT patent application no. PCT/EP2013/061560, which was filed on Jun. 5, 2013, which claims the benefit of priority of U.S. provisional application No. 61/668,934, which was filed on Jul. 6, 2012 and claims the benefit of priority of U.S. provisional application No. 61/761,560 which was filed on Feb. 6, 2013, each of which are incorporated herein in its entirety by reference.

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

In an embodiment of a lithographic apparatus, an illumination system is configured to condition the radiation beam before the radiation reaches the patterning device (e.g., a reticle). Once the radiation beam has been patterned by the patterning device, a projection system directs the radiation to the substrate. The illumination system and the projection system comprise an optical system. The optical system of the projection system may be situated within an ultra-clean gas environment to prolong the lifetime of the optics of the projection system. The ultra-clean gas environment may be termed a protective environment, or a micro environment. This environment reduces the optical system contamination (both cleanable and non-cleanable), thereby reducing the degradation in radiation beam uniformity and reducing the amount of stray radiation lost from the system.

An internal gaseous environment in the region of the patterning device may be controlled. A controlled gaseous environment helps prevent contaminants and/or gas (e.g., air) with a variable property (e.g. refractive index) interfering with the radiation beam. A controlled gaseous environment additionally or alternatively helps prevent contaminants contacting with a sensitive element of the patterning device and thereby, for example, causing damage or imaging defects. The internal gaseous environment will typically be substantially isolated from the region outside, but may not be perfectly sealed off. A gas supply system having an outlet into the internal gaseous environment may be provided and configured to maintain an overpressure in the internal gaseous environment. The overpressure may drive a substantially constant flow of gas out of the internal gaseous environment. The substantially constant outward flow of gas may help to prevent inflow of contaminants. The substantially constant flow of gas may be channeled through a leaky seal, for example through opposed flow-restricting surfaces.

The patterning device support may predominantly be configured to be driven linearly, i.e., in a certain (e.g., predetermined) direction. The direction may be perpendicular to the axis of the projection system, which is referred to as the Z-axis. The direction may be referred to as the Y-direction.

In a lithographic apparatus, a projection beam is patterned by a patterning device. A difficulty is that the patterning device absorbs some of the radiation from the projection beam and thereby heats up. In some instances this can result in a spatially non-uniform temperature distribution in the patterning device. It can take some time for the patterning device to reach a steady state temperature during imaging of a sequence of substrates. This results in the patterning device expanding during the imaging of the first few substrates of the lot to be imaged.

As a result of thermally induced expansion, whether uniform or not, overlay error may result.

It is desirable, for example, to reduce or eliminate error resulting from absorption of radiation by the patterning device.

According to an aspect, there is provided a lithographic apparatus comprising:

a support structure configured to support a patterning device, the patterning device serving to pattern a radiation beam according to a desired pattern and having a planar main surface through which the radiation beam passes;

at least one outlet opening configured to direct a flow of gas onto the patterning device;

at least one inlet opening configured to extract gas which has exited the outlet opening, wherein the outlet opening and inlet opening are provided in a facing surface facing the planar main surface of the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
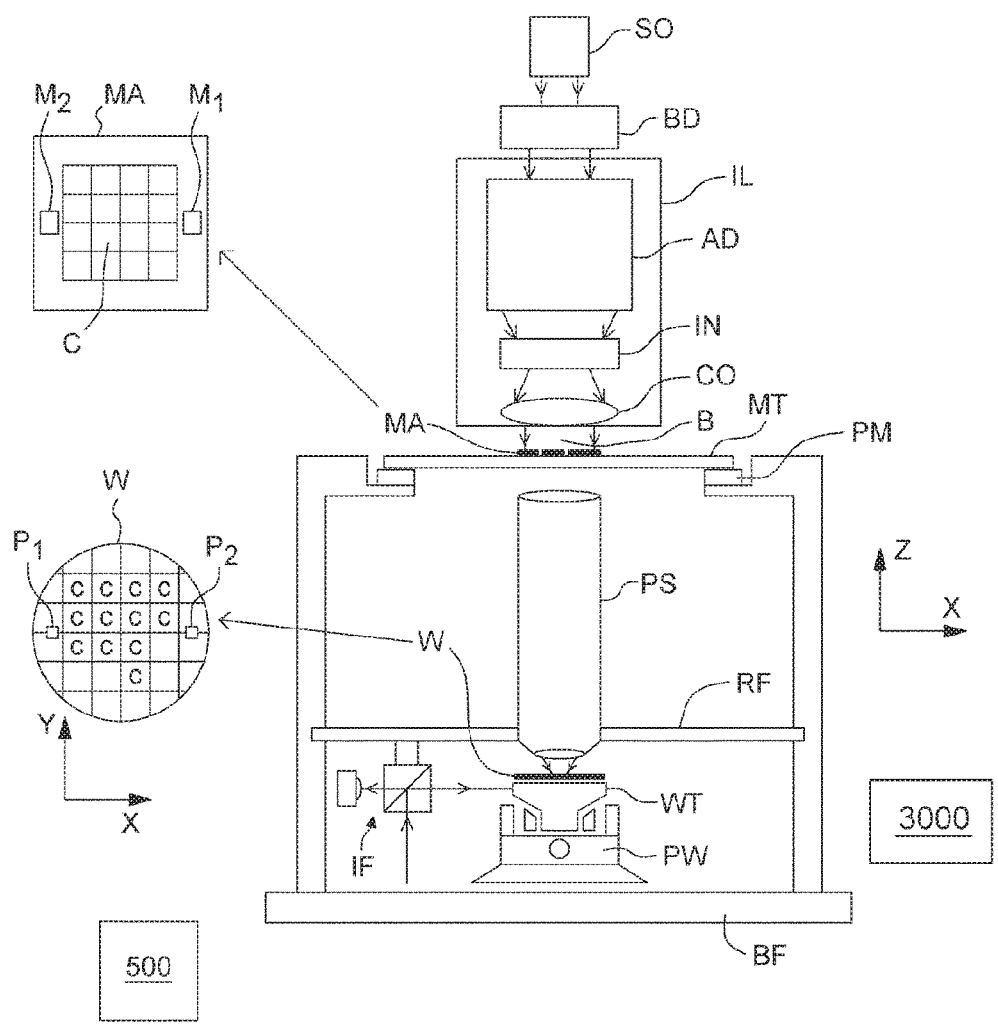
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

An embodiment of the present invention may be applied to any kind of lithographic apparatus including, but not limited to an immersion lithographic apparatus. A lithographic apparatus of an embodiment of the present invention may be a dry lithographic apparatus (i.e. a non-immersion type lithographic apparatus). An embodiment of the present invention can be used with a lithographic apparatus that does not comprise a liquid handling structure. The type of lithographic apparatus in which an embodiment of the present invention may be implemented is not particularly limited.

In a lithographic apparatus according to an embodiment of the invention, an illumination system IL conditions a radiation beam. The illumination system IL comprises optics. The conditioned radiation beam is patterned by a patterning device MA supported on a support structure MT. The support structure MT can move the patterning device MA as illustrated by arrows 50 in FIG. 2. The patterned radiation beam is directed by a projection system PS to a substrate W. The projection system PS comprises optics.

Figure 2:
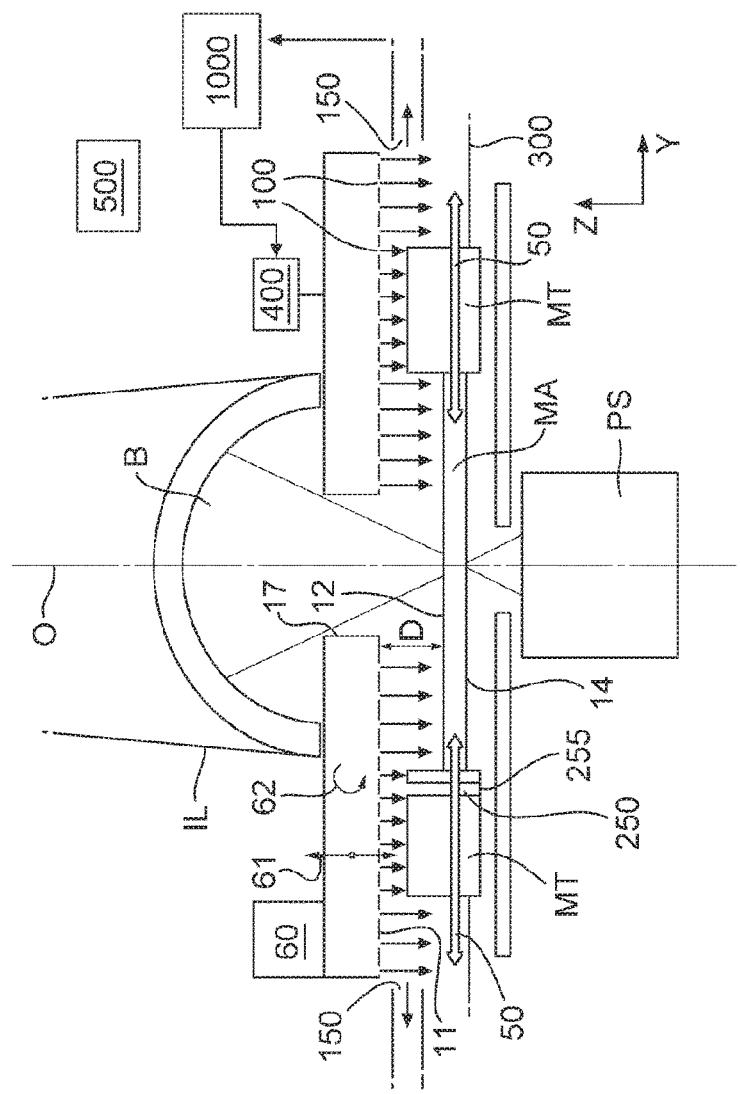
FIG. 2 depicts schematically and in cross-section a support structure for a patterning device and a portion of the adjacent illumination system and projection system.

FIG. 2 shows components at the bottom of the illumination system IL, the patterning device MA and the top part of the projection system PS, in cross-section and schematically.

As mentioned above, it may be desirable to maintain a controlled internal gaseous environment in the region of the patterning device MA (above and/or below the patterning device MA). FIG. 2 depicts an arrangement, explaining how an internal gaseous environment can be achieved in a region above, for example, the support MT.

The internal gaseous environment in this embodiment is located between the patterning device MA and support MT on one side, and a final element (and surrounding hardware) of the illumination system IL on the other side. The internal gaseous environment depicted is thus a volume through which the radiation beam B will pass before it encounters the patterning device MA.

Optionally, an overpressure is maintained within the internal gaseous environment. The overpressure results in an outward flow of gas.

The beam B passes through the patterning device MA. Some of the energy from the beam B is absorbed by the patterning device MA and this results in the patterning device MA heating up by, e.g., as much as 4° C. due to absorption of the beam B, for example in a chrome layer and/or another layer. This leads to deformation of the patterning device MA due to thermal expansion. This deformation may be uniform or non-uniform and may lead to overlay error of about 2.5 nm. Because the heating can be very non-uniform, it may be difficult to measure the temperature distribution and thereby take corrective action. As a result large intra field overlay error may occur.

The patterning device MA may have first and second planar main surfaces 12, 14. In use the first planar main surface 12 is the one on which the beam B impinges after it exits the illuminator IL. In an embodiment, as illustrated, the first planar main surface 12 is the top or upper surface of the patterning device MA. The beam B passes through the patterning device MA from the first planar main surface 12 to the second planar main surface 14.

Because the beam B has to be able to pass through the patterning device MA, no cooling device can be provided in the patterning device MA either to the top or bottom side of the patterning device MA. A gas flow speed around the patterning device MA may typically be low so it may not penetrate a boundary layer of gas on the surface of the patterning device MA. The boundary layer is a layer of stationary gas next to the surface of the patterning device MA. The gas is held stationary by friction with the surface of the patterning device MA. Heat transfer from the patterning device MA towards the environment due to convection in gas is poor compared to the heat transfer possible due to conduction. Currently the gas flow speeds around the patterning device MA may be low enough to ensure laminar flow. If turbulent flow is present, particularly in the presence of temperature differences, this may disturb the image projected on the substrate W and may also lead to overlay error.

With a current low flow speed of extremely clean dry air, the heat transfer coefficient from the patterning device MA towards the environment may be about 10 W/m$^2$K on each of the first and second planar main surfaces 12, 14 of the patterning device MA. Therefore a total thermal coupling to the surrounding environment (i.e. heat transfer from the patterning device MA to the surrounding environment) of about 20 W/m$^2$K may be present.

In an embodiment one or more measures are taken to increase the heat transfer coefficient from the patterning device MA using one or more gas flows.

At least one outlet opening 100 is provided to direct a flow of gas onto the patterning device MA. A gas source 400 provides gas to the at least one outlet opening 100. In an embodiment a plurality of outlet openings 100 are provided. In the embodiment of FIG. 2 the at least one outlet opening 100 is configured to direct a flow of gas only on one planar main surface 12, 14 of the patterning device MA. This may be advantageous from a complexity point of view and to keep surrounding environmental gas out, at the expense of reduced total heat transfer. However in an embodiment at least one outlet opening 100 is provided on each side of the patterning device MA.

The outlet opening 100 may be in any form. It may comprise a simple opening with any shape, in plan (i.e. in the plane of the surface in which the opening is formed), including, but not limited to, circular, square, or oblong. In an embodiment the at least one outlet opening 100 is elongate, for example in the form of a slit. In an embodiment, the outlet opening 100 is formed in a facing surface 11 facing a major surface, i.e., the planar main surface 12, 14 (e.g. top and/or bottom) of the patterning device MA. This makes configuring the outlet opening 100 to direct a gas flow onto the patterning device MA relatively simple.

In an embodiment the flow of gas out of the outlet opening 100 is in a direction substantially perpendicular to the first planar main surface 12 (e.g. top surface) of the patterning device MA. The outlet opening 100 is configured to direct a flow, e.g., a jet, of gas towards or onto the patterning device MA. In an embodiment, the gas flow is directed by the outlet opening 100 at the patterning device MA within 30°, desirably within 15°, of perpendicular to the top surface of the patterning device MA. This is advantageous as it helps the gas flow break through the boundary layer on the patterning device MA.

In an embodiment the facing surface 11 has a beam opening 17 defined in it. The beam opening 17 allows for the passage of the beam B through the facing surface 11. In an embodiment gas from the outlet opening 100 is not provided to the space through which the beam B passes. This is advantageous as turbulent flow in the space through which the beam B passes may introduce an imaging error.

In an embodiment, the number and spacing of outlet openings is configured to provide a gas flow at some point in time over all areas of the patterning device MA (but not all at the same point in time) when the patterning device MA moves through its range of movement. That is, the patterning device MA may be moved by the support structure MT in the Y direction as illustrated by arrows 50. In an embodiment, the extent of the outlet opening 100 is such that whatever the position of the patterning device MA, a gas flow will always impinge on it, thereby cooling it. As illustrated in FIG. 2, a portion of the patterning device MA currently aligned with the optical axis O of the apparatus may not have a gas flow impinging on it. This is not a difficulty because of the large amount of movement of the patterning device MA resulting in all areas receiving a flow of gas over them at some point in time during operation. In an embodiment, the outlet opening 100 surrounding the path of the beam of radiation B is configured such that the gas flow leaving it is directed radially inwardly towards the portion of the patterning device MA aligned with the optical axis. In this way, a gas flow onto the whole top surface of the patterning device MA can be achieved.

In an embodiment, the flow of gas out of the outlet opening 100 is such that the gas flow at the patterning device MA has a Reynolds number of greater than or equal to 2000, greater than or equal to 2500 or greater than or equal to 3000. That is, the flow is turbulent flow. This turbulent flow results in a large increase in heat transfer compared to the case of a laminar flow of gas.

In order to achieve turbulent flow at the patterning device MA, it is desirable that the patterning device MA is a distance from the outlet openings 100 of less than 15 times the maximum cross sectional dimension of the outlet opening 100. If the outlet opening 100 is circular in cross section with a diameter of say 10 mm, the patterning device MA should be desirably within 150 mm of the outlet opening 100. The lower the distance between the outlet opening 100 (e.g. the facing surface 11) and the patterning device MA the better. Therefore, it is desirable that the distance between the outlet opening 100 and the patterning device MA is less than 10 times or less than 5 times the maximum cross sectional dimension of the outlet opening 100. An outlet opening 100 diameter of 10 mm and a distance to the patterning device MA of 50 mm results in a Reynolds number of about 3000 at the patterning device MA with a gas flow rate of 5 m/s.

In an embodiment, the facing surface 11 may be moved in the Z direction (in the direction of the optical axis O) to adjust the distance D between the outlet opening 100 and the patterning device MA. For this purpose an actuator 60 is configured to move the facing surface 11 in the direction of the optical axis O as illustrated by arrow 61. Advantageously, this allows the amount of heat transfer between the gas and the patterning device MA to be adjusted in use.

In an embodiment, the actuator 60 may additionally or alternatively tilt the facing surface 11 relative to the optical axis O as indicated by arrow 62. Therefore, the distance D between the facing surface 11 and the patterning device MA may be different at different areas, in plan, of the patterning device MA. In this way advantageously different conditioning effects can be achieved at different areas of the patterning device MA, in plan.

Figure 8:
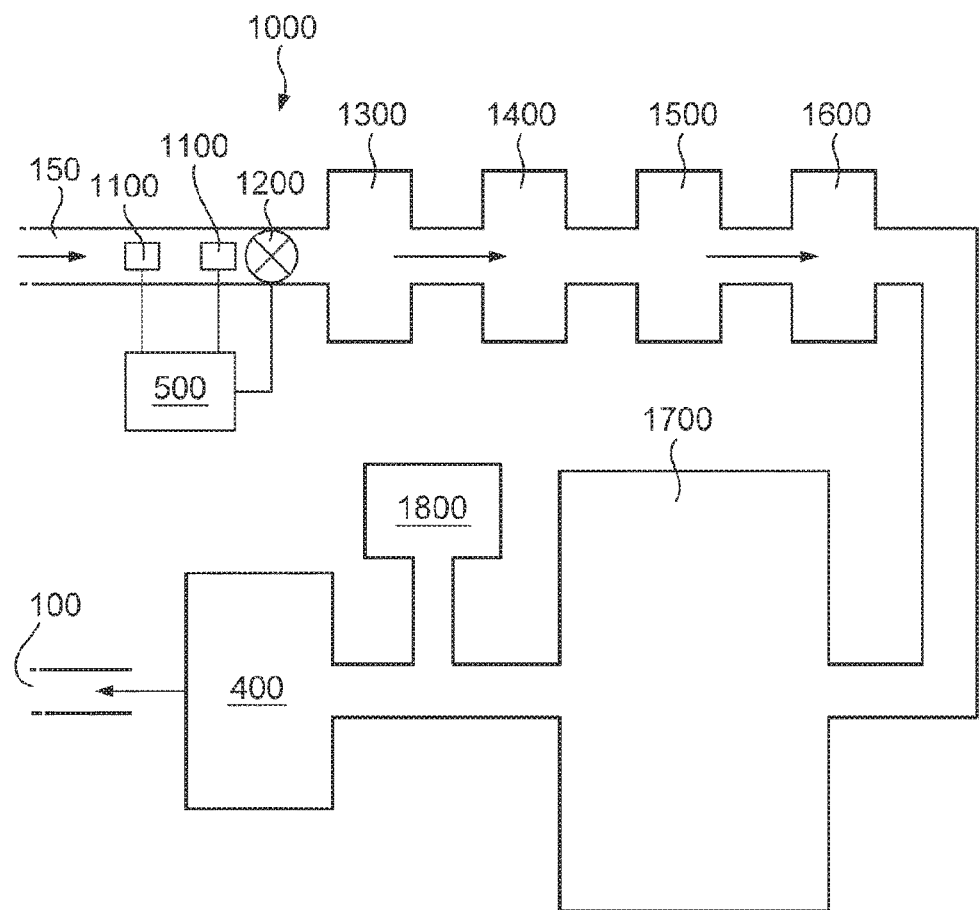
FIG. 8 is a schematic illustration of a gas recycling system.

Desirably the gas is thermally conditioned prior to being provided to the outlet opening 100. A temperature conditioning unit 1600 is illustrated in the system of FIG. 8. This is advantageous as the temperature conditioning unit 1600 (which may include a heating element and/or a cooling element) allows the temperature of the gas to be varied so that the patterning device MA can achieve the desired set point temperature even faster. A set point temperature which the temperature conditioning unit 1600 brings the gas to can be set based on a measured temperature of the patterning device MA (for example in a feedback or feed forward control loop) and/or exposure dose and/or patterning device transmission. This active control of the temperature of the gas exiting the outlet opening 100 results in faster and more accurate temperature conditioning of the patterning device MA.

A controller 500 is provided to control the flow rate out of the outlet opening 100. In an embodiment the controller 500 is configured to achieve a turbulent flow. In combination with the dimensions and geometry of the opening 100, a flow rate of gas to help ensure that the flow of gas is in the turbulent regime is selected. The controller 500 can also control the temperature conditioning unit 1600.

In an embodiment the flow of gas out of each of the outlet openings 100 has a velocity of about 5 m/s. Because the turbulent jet breaks the boundary layer on top of the patterning device MA, the heat transfer coefficient is about 100 W/m$^2$K. Therefore even if the outlet opening 100 is only provided on one side of the patterning device MA, a total heat transfer coefficient of about 110 W/m$^2$K (100 on one side+10 on the other side) may be achieved. This will result in a decrease in heating of the patterning device MA by a factor of five and can result in a reduction in the overlay error to 0.5 nm.

The closer the distance of the outlet opening 100 to the patterning device MA the higher the heat transfer coefficient. When the gas exiting the outlet opening 100 is air, if the distance D between the outlet opening 100 and the patterning device MA is 100 mm, a heat transfer coefficient of 50 W/m$^2$K is achievable (leading to reduction in the patterning device MA heating by factor of 3 and reducing the overlay error to 0.9 nm). Where the distance D is 50 mm the heat transfer coefficient is 70 W/m$^2$K leading to a patterning device MA heating reduction factor of 4 and an overlay error of 0.7 nm. For a distance D of 10 mm, the heat transfer coefficient is 100 W/m$^2$K which leads a patterning device MA heating reduction factor of 5 and an overlay error of 0.5 nm. Therefore it is desirable that the distance D is less than or equal to 200 mm, desirably less than or equal to 100 mm or desirably less than or equal to 50 mm.

Because helium has a thermal conductivity approximately six times greater than that of air, using helium out of the outlet opening 100 significantly increases the heat transfer coefficient compared to air (at the same volume flow by a factor of about 40-50% in the present application) at 22° C. For the distance D=100 mm and using helium, a heat transfer coefficient of approximately 75 W/m$^2$K on the first (top) planar main surface 12 may be achieved. The heat transfer coefficient on the second (bottom) planar main surface 14 is 10 W/m$^2$K as no gas flow is provided on that surface. This leads to the patterning device MA heating reduction by a factor of about 4 and leads to an overlay error of only about 0.6 nm. At D=50 mm and using helium, the heat transfer coefficient is approximately 105 W/m$^2$K, a patterning device MA heating reduction factor of about 6 and an overlay error of about 0.4 nm. For D=10 mm and using helium, the heat transfer coefficient is approximately 150 W/m$^2$K, a patterning device MA heating reduction factor of about 8 and an overlay of about 0.3 nm. The use of helium is therefore advantageous. The use of hydrogen is advantageous for similar reasons, though the use of hydrogen may be more problematic because of its explosiveness when mixed with air.

Helium is expensive and its use may not be commercially viable without recycling. A recycling system 1000 is shown in FIG. 8. In order to recycle the helium at least one inlet opening 150 is provided to extract gas (i.e. helium) which has exited the at least one outlet opening 100. In FIG. 2 the opening 150 is provided distant from the outlet opening 100 and positioned away from the optical axis O. However inlet opening 150 may be provided at any location so long as it achieves the function of recovering gas from the outlet opening 100. An underpressure source is provided to generate an underpressure in the inlet opening 150.

In the embodiment of FIG. 2 the helium is provided to a space between the illumination system IL and the patterning device MA. In an embodiment the space is open to the surrounding environment, having a closed space here would be advantageous as that could make it easier to recover the helium and an advantage of the presence of helium is extended to a position measurement device 40 (illustrated in FIG. 7). The environment could be closed by providing a container (e.g. a vacuum chamber) all around the support structure MT and sealed to the illumination system IL and projection system PS. However it may be difficult to provide a closed environment here as patterning device MA exchange may be necessary in use, for example every 10-15 minutes. In an embodiment the space is closed or substantially closed to the surrounding environment.

In an embodiment the helium is provided to a space open to the surrounding environment. In an embodiment, in order to help prevent environmental gas from entering the space, a leak of helium from the space is desirable. This can be arranged by arranging that the controller 500 controls the gas flow out of the outlet opening 100 and into the inlet opening 150, such that the gas flow out of the outlet opening 100 is greater than the gas flow into the inlet opening 150. This has an advantage that most of the gas entering the inlet opening 150 should therefore be helium from the outlet opening 100. As a result the load on the recycling system 1000 in terms of purification is decreased (described in more detail below).

In an embodiment an overpressure is present in the space compared to the surrounding environment. Such a system may be advantageous for the reason of excluding potentially contaminant gas and/or contaminant particles from the space.

The recycling system 1000 is described below with reference to FIG. 8. The recycling system 1000 takes gas from the inlet opening 150 and provides it (at the appropriate humidity, temperature and concentration) to the gas supply system 400 which provides gas to the outlet opening 100.

In an embodiment the controller 500 is configured to control the flow of the gas through the outlet opening 100 and/or inlet opening 150 so that gas pressures on each side of the patterning device MA are substantially equal. This is possible where gas provision to one or both of the planar main surfaces 12, 14 of the patterning device MA is controlled by controller 500; for example, gas pressure could be measured on one side and the flow on the other side adjusted accordingly (for example using a feedback loop on a measured pressure). This helps prevent gas flow through any gap on either side of the patterning device MA which might be undesirable from a contamination or imaging point of view.

If the pressures on each side of the patterning device MA are substantially equal no driving force for the flow of gas from one side of the patterning device MA to the other is present. This advantageously reduces the chance of contamination.

A hole 250 may be provided through the support structure MT (or patterning device MA) for use during measurement of the energy of the beam B which may be useful for calibration, for example. In an embodiment the hole 250 is blocked to the passage of gas by a transparent member 255.

Turbulent flow between the patterning device MA and projection system PS may be undesirable as this can lead to refractive index variations in that space and thereby error in the image projected onto the substrate W. To help prevent turbulent flow under the patterning device MA, in the case that outlet opening 100 is only provided on one side of the patterning device MA (the side of the illumination system IL), one or more baffles 300 may be attached to the support structure MT, effectively closing the space below the patterning device MA from the space above the patterning device MA. On the other hand, an advantage of using helium is that the variation of refractive index of helium with temperature is about 20% less than that for air. As a result, turbulent flow of helium is less deleterious to imaging quality than is the case with turbulent flow of air.

In an embodiment any gap in the apparatus which allows gas to move between a space above the first planar main surface 12 and a space below the planar main surface 14 is less than 0.5 mm in width. For a gap smaller than this size, a flow of gas from one side of the patterning device MA to the other is greatly decreased.

Figure 3:
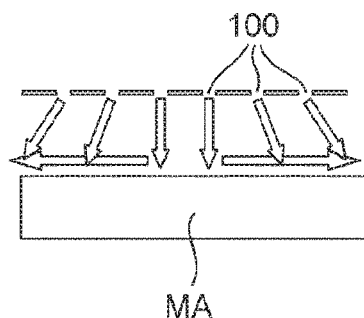
FIG. 3 depicts schematically and in cross-section a patterning device and a facing surface.

A further embodiment is illustrated schematically in FIG. 3. In FIG. 3 the outlet opening 100 is provided above the patterning device MA in a surface facing the main top surface of the patterning device MA. As there is nowhere for the gas exiting the central outlet opening 100 to go, a radially outward flow of gas is present, as illustrated. The need for the gas to flow radially outwards pushes the jets of gas leaving the outlet opening 100 away from vertical (e.g. angled).

Figure 4:
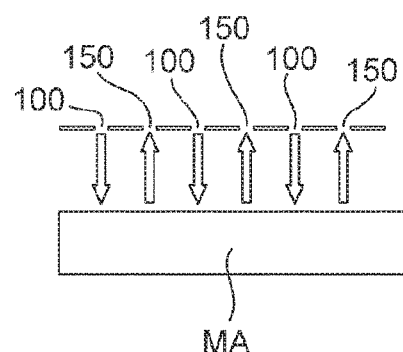
FIG. 4 depicts schematically and in cross-section a patterning device and a facing surface.

In the embodiment of FIG. 4 outlet opening 100 is provided adjacent the inlet opening 150. In an embodiment the inlet opening 150 is provided in the facing surface 11. The inlet and outlet openings 100, 150 may be provided in any pattern. In an embodiment the inlet and outlet openings 100, 150 are arranged alternately. This increases the heat transfer rate even further. This is because adjacent jets of gas leaving the outlet opening 100 do not interfere with one another so that the radial outward flow illustrated in FIG. 3 is not present. Additionally, escape of gas radially outward of the facing surface 11 relative to the optical axis O or radially inwardly toward the optical axis O can be conveniently reduced or prevented if necessary.

Figure 5:
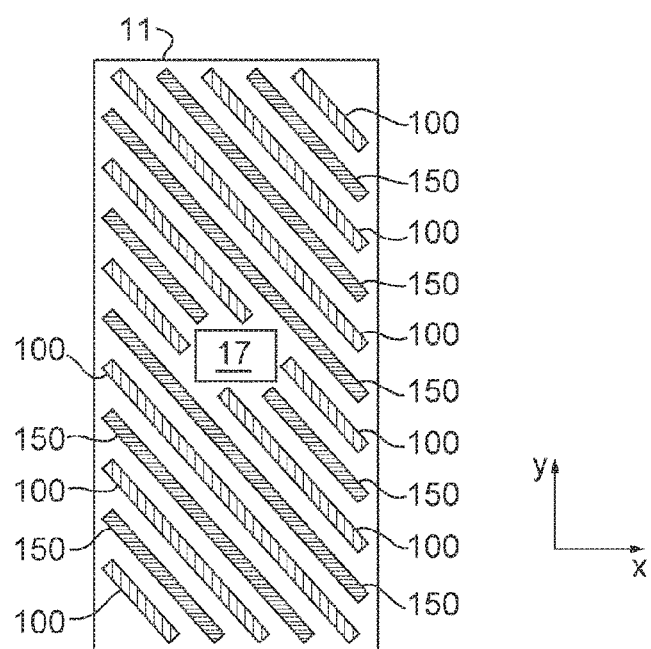
FIG. 5 depicts schematically and in plan the part of the illumination system illustrated in FIG. 4.

FIG. 5 shows an embodiment of the facing surface 11 of FIG. 4 in plan. In the embodiment of FIG. 5 the outlet and inlet openings 100, 150 have a shape, in plan, which is elongate. In an embodiment the shape of the outlet and/or inlet opening 100, 150 is that of a slit. In an embodiment, such as illustrated in FIG. 5, the openings 100, 150 are elongate in a direction with an acute angle to the x and y directions, i.e. they are slanted. The x and y directions are the step and scan directions of the lithographic apparatus. A slanted slot configuration combines the benefit of a slot orientated in the x direction and orientated in the y direction in that complete coverage of the patterning device MA by a gas flow may be achieved without a disadvantage of the possible formation of one or more cold lines on the patterning device MA as a result of frequent movement in only the x or only the y direction when a slot orientated in the x or y direction would supply a flow of gas repeatedly onto the same portion of the patterning device MA. The slots which are elongated and not orientated in either the step or scan directions help provide uniform cooling of the patterning device MA without a significant disturbance force being applied to the patterning device.

In an embodiment the outlet and/or inlet openings 100, 150 may be a combination of slits such as illustrated in FIG. 5 and other shaped openings. For example, an inlet opening 150 may be provided around the beam opening 17. Such an inlet opening 150 may be continuous or discontinuous. The purpose of providing such an inlet opening 150 is to reduce or eliminate the chance of gas from an outlet opening 100 in the facing surface 11 from entering the space through which the beam B passes. Additionally or alternatively the purpose of such an inlet opening 150 may be to reduce the speed of gas entering the space through which the beam B passes and thereby help avoid turbulent flow in that space.

In an embodiment, for example as illustrated in FIG. 2, an inlet opening 150 may be provided in the facing surface 11 surrounding the outlet and inlet openings 100, 150. Such an inlet opening 150 can be used to reduce or prevent escape of gas exiting the outlet openings 100 into the surroundings of the apparatus. This may reduce or eliminate the need for inlet openings 150 distant from the edge of the facing surface 11 (i.e. inlet openings 150 not formed in the facing surface 11) such as illustrated in FIG. 2. As described with reference to FIG. 11, this may additionally be beneficial in reducing or preventing gas which has exited the outlet openings 100 from reaching a space through which a beam of electromagnetic radiation associated with a position encoder 40 passes through. An inlet opening 150 formed in the facing surface 11 surrounding the other outlet and inlet openings 100, 150 in the facing surface 11 may be continuous or discontinuous.

Figure 6:
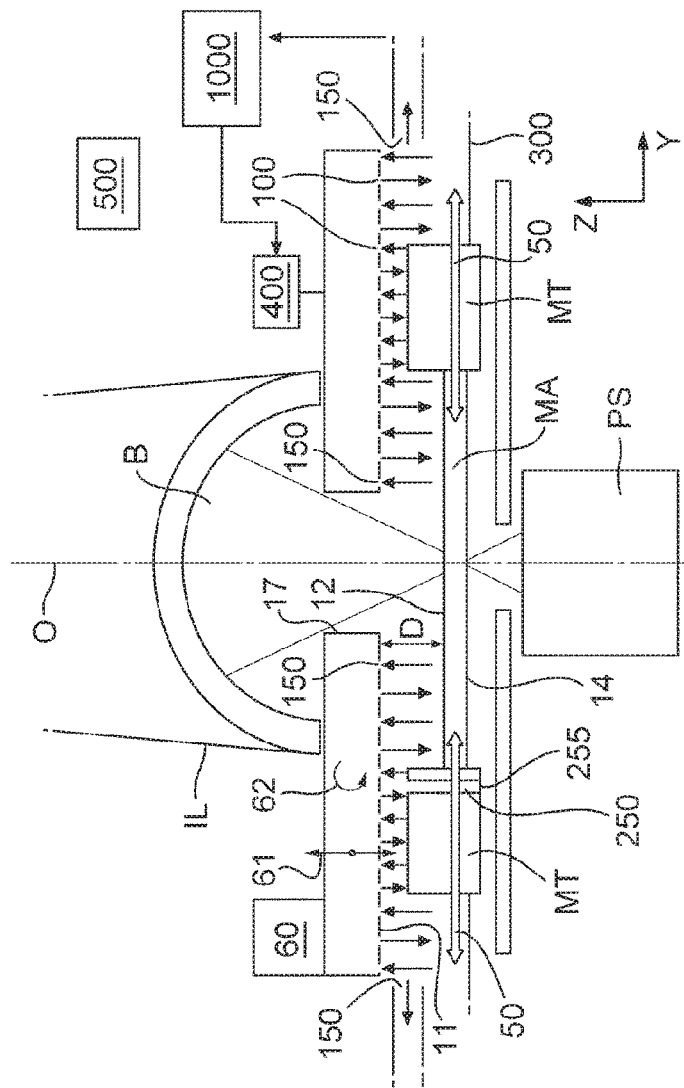
FIG. 6 depicts schematically and in cross-section a support structure for a patterning device and a portion of an adjacent illumination system and a projection system.

The embodiment of FIG. 6 is the same as that of FIG. 2 except as described below. In the embodiment of FIG. 6 both the outlet and inlet openings 100, 150 are provided in the facing surface 11. The outlet and inlet openings 100, 150 may be provided in any pattern. The arrangement in FIGS. 4 and 5 and as described above is desired however. The inlet opening 150 not formed in the facing surface 11 is optional, particularly if an inlet opening 150 formed in the facing surface 11 surrounds all the other inlet and outlet openings 150, 100 in the facing surface 11 as described above.

As illustrated in FIG. 6, in an embodiment at least one inlet opening 150 is provided radially inward to the beam opening 17 (relative to the optical axis D) of any of the outlet openings 100. This advantageously reduces or even prevents significant turbulence in gas through which the beam B passes. Additionally or alternatively this can reduce or prevent the presence of gas which has exited an outlet opening 100 from entering the space through which the beam B passes. The presence of a mixture of gases in the space through which the beam B passes may be disadvantageous, unless the gases are very well mixed, because of the differences in refractive index of different gases, which can lead to imaging error.

As will be clear from the above, the examples and embodiments from FIGS. 2-6 may be used with helium or with another gas, for example argon, nitrogen, hydrogen or extremely clean dry air (XCDA), or a mixture of gases. The use of a recycling system 1000 is desirably made if the gas is helium because of the high expense of helium.

Figure 7:
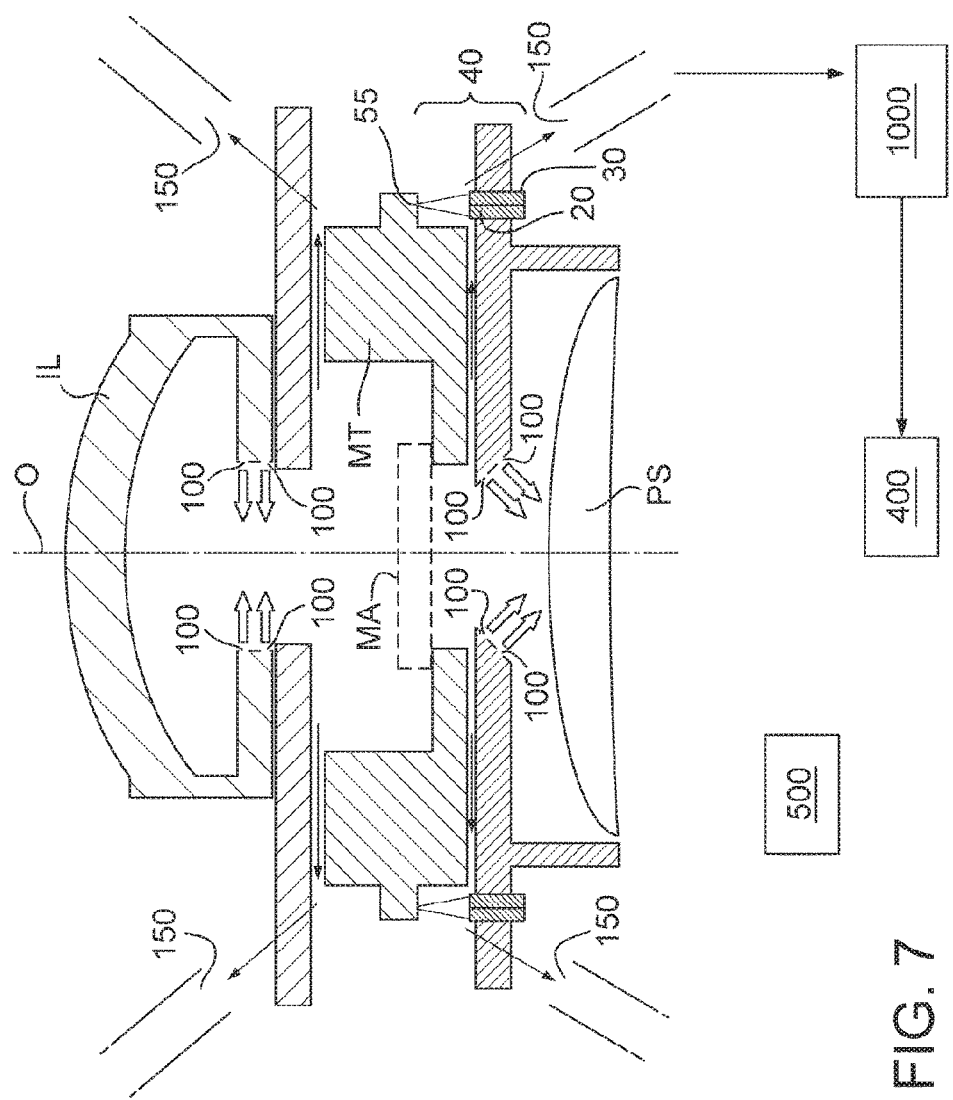
FIG. 7 depicts schematically and in cross-section a support structure for a patterning device and a portion of an adjacent illumination system and projection system.

FIG. 7 shows an embodiment which is the same as in FIG. 2 except as described below. The features of the examples and embodiments of FIGS. 2-6 and 7 may be combined.

The embodiment of FIG. 7 illustrates how a micro environment is created in the area surrounding the patterning device MA. In an embodiment the outlet opening 100 is provided to create a gas barrier to make it harder for contaminant particles to enter a space adjacent the final element of the illumination system IL and/or the first element of the projection system PS. The respective spaces are held at a slight overpressure to create a flow of gas out of the spaces adjacent the final element of the illumination system IL and the first element of the projection system PS. This out flow of gas will then leak past the support structure MT to the surrounding environment. Inlet opening 150 may be positioned to collect the gas for recycling by the recycling system 1000 and further use by the gas supply system 400.

The generation of a barrier by a gas flow through outlet opening 100 may be a system used in combination or instead of the outlet opening 100 illustrated in FIGS. 2-6 which direct a flow of gas at the patterning device MA. In the embodiment of FIG. 7 the flow of gas out of the outlet opening 100 is not directed at the patterning device MA. However, due to the slight over pressure in the area of the patterning device MA, the final element of the illumination system IL and first element of the projection system PS, a flow of gas which has left the outlet opening 100 will flow past the patterning device MA in a direction radially outward relative to the optical axis O. If the gas used is helium, because of its higher thermal conductivity than air, a larger transfer of heat from the patterning device MA due to the flow of helium over its surface can be achieved than for air. Additionally, because of the low temperature dependency of the refractive index of helium when compared to air (20% that of air), stability of the image projected on the substrate W is improved.

When using helium, the flow of gas over the patterning device MA may be turbulent or may be laminar, depending upon the flow rates and geometry used.

FIG. 7 illustrates schematically a measurement system which is a position measurement sensor configured to measure the position of the support structure MT. In this instance an encoder 40 is provided comprising a sensor 20 and a radiation outlet 30 (e.g., a source or a connection to a source). A beam of radiation is directed towards a grating 55 attached to the support structure MT whose position is to be measured relative to the projection system PS. The positions of the encoder 40 and grating 55 may be reversed, in all the embodiments of FIGS. 7, 10, 11 and 12.

In one embodiment the radiation outlet 30 provides radiation of a wavelength of about 600 nm, for example. In one embodiment the radiation outlet 30 provides radiation of a wavelength of about 780 nm. However, the exact wavelength is not critical.

In the embodiment of FIG. 7 the encoder 40 is fixed relative to the projection system PS and the grating 55 is fixed relative to the patterning device MA. The radiation from the radiation outlet 30 is reflected and/or refracted by the grating 55 and this radiation is then detected by the sensor 20. Positional measurement is carried out by measuring the position of the sensor 20 with respect to the grating 55 in one or more degrees of freedom. The measurement system may be similar to that disclosed in U.S. patent application No. 61/637,729 filed 24 Apr. 2012, which is hereby incorporated in its entirety by reference, or one of a system referred to in that document. In an embodiment helium is drawn through the space through which the beam passes so that it is filled with helium. This reduces changes in refractive index due to the temperature independence of the refractive index of helium, as described above.

FIG. 8 illustrates an embodiment of a recycling system 1000. The recycling system 1000 may be the same as the recycling system for helium described in United States patent application publication no. US 2012/0092631, the contents of which are hereby incorporated in their entirety by reference. Such a recycling system 1000 includes a gas source of helium, a pressure regulator and a check valve delivering a source of helium into a recirculation system to compensate for unavoidable leakage. A regenerating purifier is provided downstream of the position at which the helium is provided to help ensure ultra-high purity conditions. An overpressure relief valve is provided as well as a mass flow controller. Downstream of the mass flow controller a particle filter is implemented before the gas is provided to the gas supply system 400. A capturing device (inlet opening 150) is provided to capture gas and the gas then continues around the flow path through an overpressure relief valve, a variable restriction which can be used to adjust pressure, through a compressor back to the regeneration purifier.

The embodiment of FIG. 8 differs from this recycling system in the following ways. The presence of an overpressure relief valve is optional. The recycling system 1000 is under the control of controller 500. The controller 500 controls a suction pump 1200 and/or gas source 400 which controls the flow rate of gas into the inlet opening 150 and out of the outlet opening 100 respectively. The controller 500 controls the suction pump 1200 and/or gas source 400 based at least in part on signals received from one or more sensors 1100. Purification of helium may be difficult. Therefore it is desirable that the flow of gas into the inlet opening 150 is as pure as possible. For this purpose the sensor 1100 may be a sensor which generates a signal indicative of the purity of helium in the gas flow entering the inlet opening 150. If the signal from the sensor 1100 indicates that the purity of helium has fallen below a certain (e.g., predetermined) level, the controller 500 can reduce the underpressure generated by the suction pump 1200 (and/or increase the flow rate of helium out of the outlet opening 100). This will reduce extraction of gas other than helium through the inlet opening 150. The environment surrounding the inlet opening 150 is likely to increase in helium concentration due to helium leaving the outlet opening 100.

There is a balance to be met between the cost of helium (as much helium in the extraction as possible is desirable), the cost and complexity of the recycling system (as pure as possible helium in the extraction system is desirable) and the out flow to the environment that keeps contamination away from the optics.

In one embodiment the sensor 1100 comprises a sensor which detects the presence of gas other than helium in a gas extracted from the space. In an embodiment the sensor 1100 comprises a humidity sensor (detecting humidity would indicate the presence of air as air has a relative humidity of about 45%). A humidity sensor works by having a substrate which absorbs water and measures the change in a property (e.g. electrical capacitance or resistance). In another embodiment the sensor 1100 comprises an oxygen sensor. The oxygen sensor may be of the zirconia, electrochemical, infrared or ultrasonic type. In one embodiment two sensors 1100 are provided, namely one humidity sensor and one oxygen sensor.

The recycling system 1000 is provided with one or more separators or regenerating purifiers 1300, 1400. The separator 1300, 1400 may comprise a membrane separator (e.g.

cellulose acetate or porous graphene membrane) and/or cryogenic separation (liquification followed by distillation) and/or absorption on cooled activated charcoal.

The recycling system 1000 also comprises a dehumidifier 1500 to dry the gas and a temperature conditioning unit 1600 to bring the temperature of the recycled gas to a defined setpoint temperature.

A buffer volume 1700 is provided in the system. The buffer volume 1700 may be upstream of the temperature conditioning unit 1600, contrary to what is illustrated in FIG. 8. This gives better temperature control as the temperature of the gas is adjusted just before it is used. The helium supply device 400 is downstream of the buffer volume 1700 to supply helium to the outlet opening 100. A further source of helium 1800 may be provided in case the recycling system 1000 cannot supply enough helium.

In an embodiment the controller 500 is adapted to reduce the flow rate of gas into the inlet 150 and/or increase the flow rate of gas out of the outlet opening 100 or vice versa in response to receipt of a signal from the sensor 1100 indicative of the presence of and/or an increase in gas other than helium in the gas extracted from space through the inlet opening 150.

Figure 9:
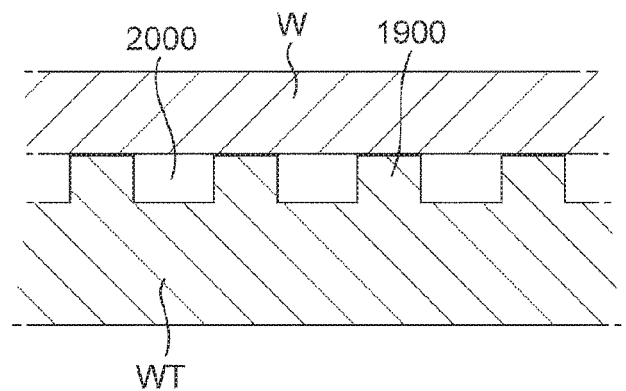
FIG. 9 is a partial cross-sectional view of a gap between a substrate and substrate support where, for example, helium may advantageously be used.

Use of the above described system either for heat transfer purposes or for reducing variations in refractive index of gas in a space at areas other than areas surrounding the patterning device MA will now be described with reference to FIGS. 7, 9 and 10.

The system can be used to provide a gas flow adjacent any object to be cooled, in particular a patterning device MA. Additionally the provision of helium to a gap between two objects between which heat transfer is desired can be provided. One such embodiment is illustrated in FIG. 9 which illustrates in cross-section, a substrate support WT and substrate W. The substrate W rests on a plurality of projections 1900 (sometimes called burls) and an underpressure is applied in a space 2000 between the burls 1900, the substrate W and the substrate support WT. It is desirable to have high heat transfer between the substrate W and substrate support WT in order to help ensure thermal uniformity. In order to increase the thermal transfer between those two objects, an underpressure of helium can be provided in the space 2000. Such an idea is described in U.S. patent application publication no. US 2006/0102849, U.S. patent application no. U.S. 61/544,875 filed Oct. 7, 2011, and U.S. patent application no. U.S. 61/521,952 filed Aug. 10, 2011, the contents of each hereby incorporated in its entirety by reference. Using inlet and outlet openings as described above and a recycling system 1000 as illustrated in FIG. 8, this becomes viable.

Figure 10:
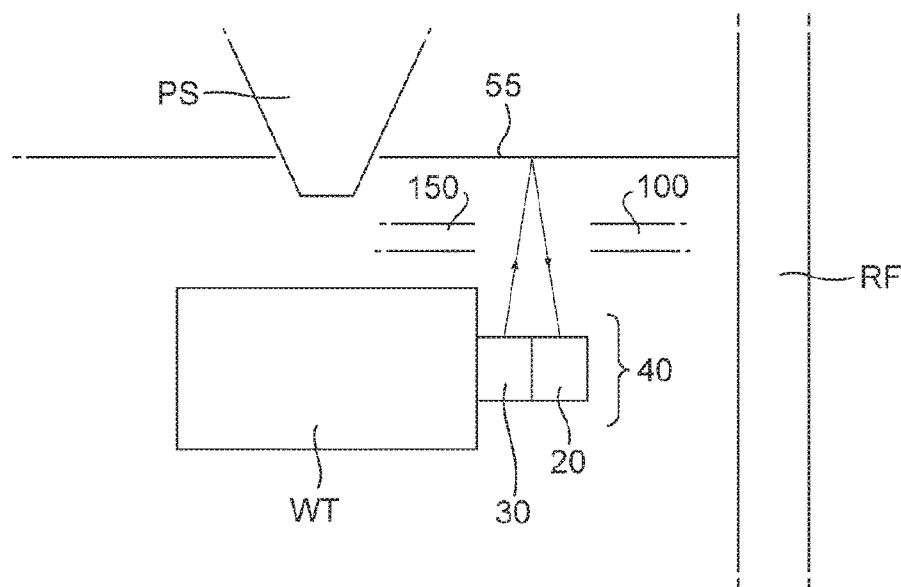
FIG. 10 is schematic illustration in cross-section, of a position measurement system in which, for example, helium may advantageously be used.

FIGS. 7 and 10 illustrate a situation where it is desirable to provide a space with a gas which has a low variation in refractive index with temperature. If a beam of radiation passes through the space filled by a gas, a change in refractive index of that gas will change how the beam of radiation interacts with the gas (e.g. how it is refracted by the gas). It is only possible to calculate the interaction of the beam of radiation with the gas with a good knowledge of the temperature distribution of the gas, which is difficult, if not impossible to obtain. Therefore, filling the space with a gas with a refractive index which will be substantially constant irrespective of temperature variations is advantageous. For this purpose inlet and outlet openings 150 and 100 and/or a recycling system 1000 as described above can be used.

FIG. 10 illustrates schematically a measurement system which is a position measurement sensor configured to measure the position of substrate table WT. The encoder 40 and grating 55 work in the same way as described in relation to the encoder 40 and grating 55 of FIG. 7 except that the grating 55 is attached to the projection system PS and the encoder 40 to the support structure MT.

The space through which the beam passes is filled with helium to reduce changes in refractive index due to the temperature independence of the refractive index of helium, as described above.

The same principles as described in relation to FIG. 10 can be applied to other types of measurement devices, including a level sensor, an alignment sensor and/or a substrate positional measurement device.

The same principles as applied to the patterning device MA can be applied to cooling a substrate W in a substrate handler 3000 illustrated in FIG. 1. A substrate handler 3000 is used to transport a substrate W from a track to the lithographic apparatus and to thermally condition the substrate W. Using a gas such as helium with a high thermal conductivity results in faster temperature stabilization. Additionally the same principles as applied to the patterning device MA can be applied to thermally conditioning a substrate in a thermal conditioner positioned within the apparatus itself. An apparatus may allow a substrate to be loaded into it from a source other than a track. For example, the substrate could be loaded manually. Such a substrate also should be thermally conditioned and the same principles as applied to cooling the patterning device MA can be applied to a substrate which is thermally conditioned within the apparatus itself.

In an embodiment the gas flow out of the outlet opening 100 also flows past an alignment mark which may be in or on the patterning device MA or may be in or on the support structure MT. Such an alignment mark is used to align the patterning device MA relative to the substrate table WT or to the substrate W.

With less heating of the alignment mark and/or the patterning device MA, there is less heating of gas between the patterning device MA and the illumination system IL and between the patterning device MA and the projection system PS which is also advantageous as this improves the stability of the image projected on the substrate W.

Because the heat transfer to the patterning device MA may be increased compared to a current system, the time constants for patterning device heating may also decrease. This means that the patterning device MA may reach a steady temperature faster than currently. This means that the apparatus may be stable faster after a lot start and correction possibilities are improved.

Figure 11:
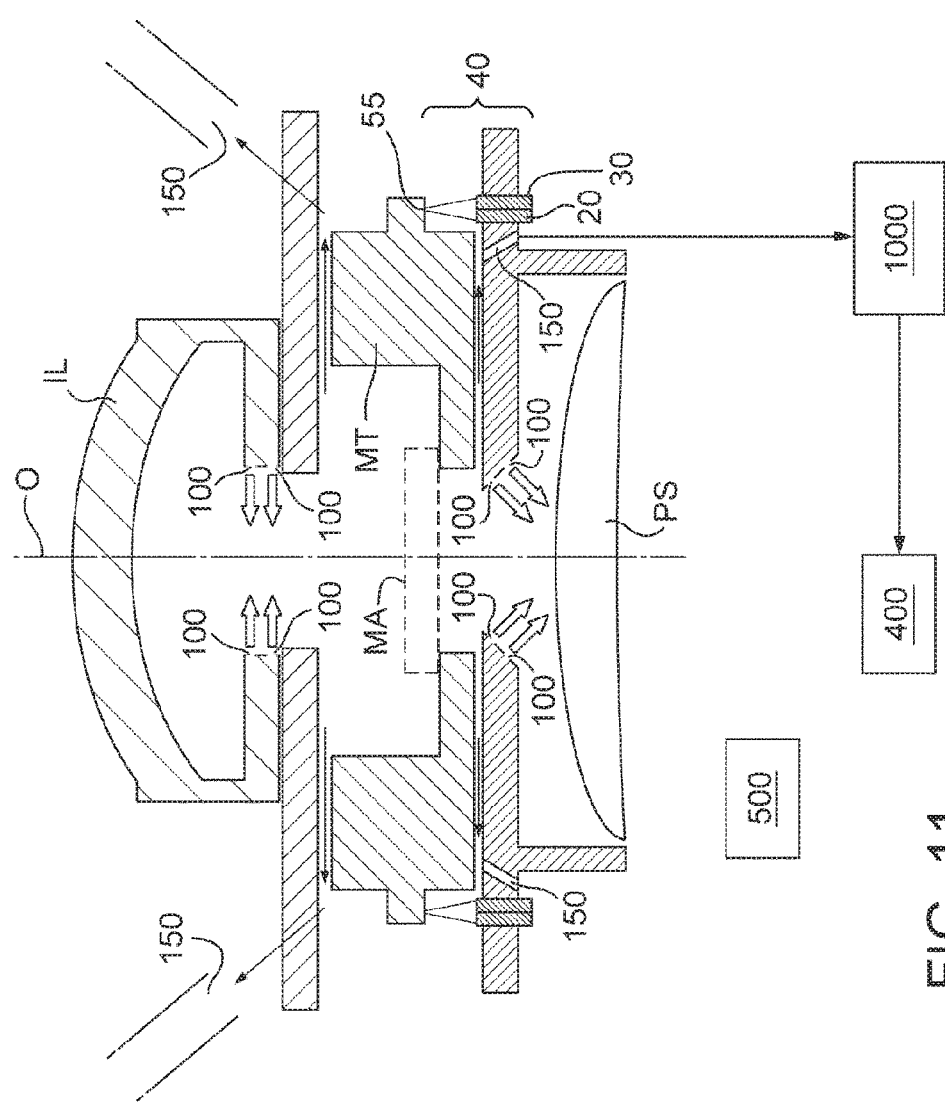
FIG. 11 is a schematic illustration in cross-section of a support structure for a patterning device and a portion of the adjacent illumination system and projection system.

FIG. 11 illustrates an embodiment which is the same as FIG. 7 except as described below.

In an embodiment, as illustrated in FIG. 11, an inlet opening 150 (not defined in a facing surface 11) is provided radially inwardly of (and adjacent) the encoder 40 relative to the optical axis O. The inlet opening 150 helps ensure that no gas from the inlet 100 reaches the space through which radiation from the encoder 40 passes. The encoder 40 may include at least one electromagnetic radiation measurement system. Although it may be desirable for helium to be in the space through which electromagnetic radiation used for measuring in the electromagnetic radiation measurement system passes, if a mixture of air and helium is present, this may be deleterious. Therefore, in the embodiment of FIG. 11, one or more measures are taken to help avoid the presence of helium in the space through which electromagnetic radiation used for measuring in the electromagnetic radiation measurement system passes. An opening 150 radially inward of the encoder 40 to help prevent gas from outlet opening 100 reaching the space through which radiation from an encoder 40 passes like in FIG. 11, can be provided in any other embodiment.

Figure 12:
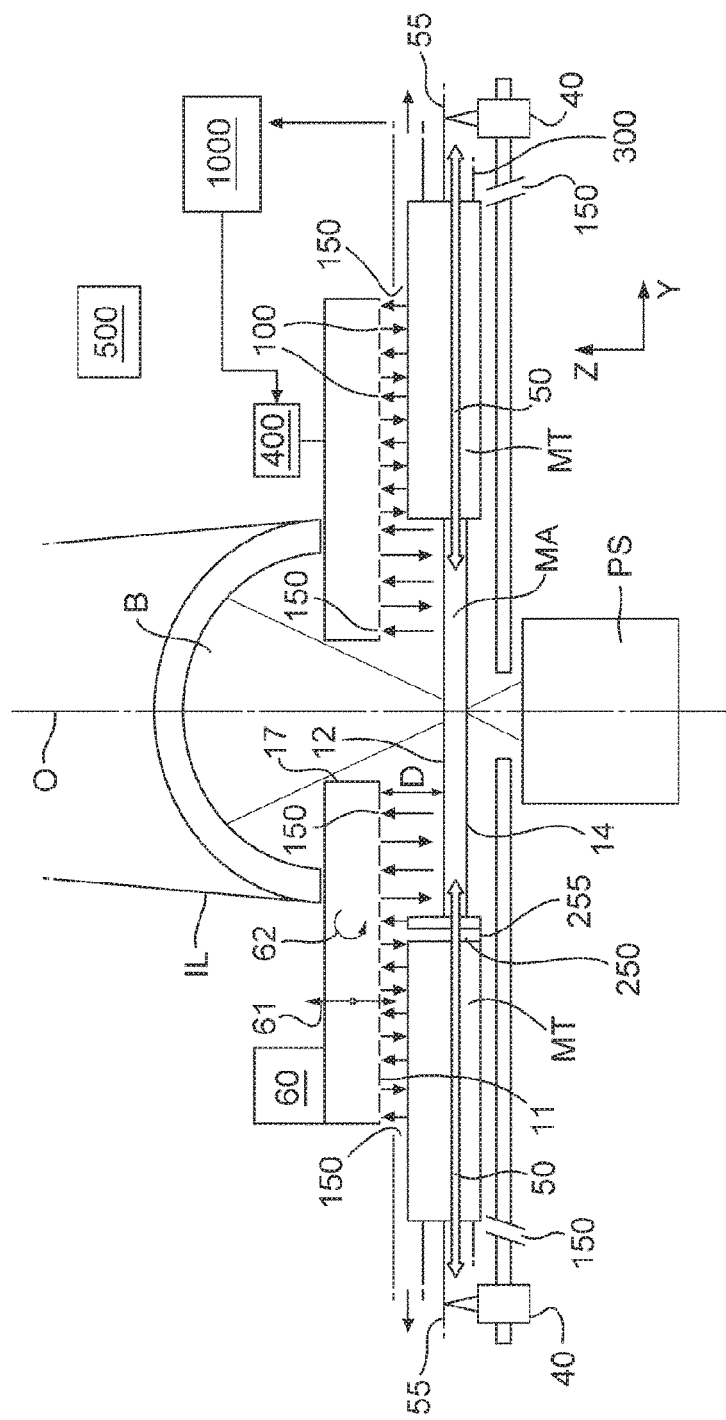
FIG. 12 is a schematic illustration in cross-section of a support structure for a patterning device and a portion of the adjacent illumination system and projection system.

The embodiment of FIG. 12 is the same as the FIG. 6 embodiment except as described below. The embodiment is similar to that of FIG. 11, but instead of having outlet opening 100 as illustrated in FIG. 7, the outlet and inlet openings 100, 150 may be provided in the facing surface 11 as illustrated in and described in connection with FIG. 6. Optionally the actuator 60 to move the facing surface 11 in direction 61 and/or tilt it as illustrated by arrow 62 in FIG. 6 may be present.

As illustrated in FIG. 12, this embodiment is provided with an encoder 40 and grating 55 like in the embodiment of FIGS. 10 and 11. Additionally, like in the embodiment of FIG. 11, an inlet opening 150 (not formed in the facing surface 11) is provided radially inwardly of the encoder 40 relative to the optical axis O. The inlet opening 150 helps ensure that no gas from the outlet openings 100 reaches the space through which radiation from the encoder 40 passes. Therefore, in addition to the opening 150 formed in the facing surface 11 which surrounds all of the other outlet and inlet openings 100, 150 in the facing surface 11, an additional inlet opening 150 is provided not in the facing surface 11 and radially inward of the encoder like in FIG. 11. Therefore, a further measure is taken to help prevent gas exiting the outlet opening 100 from reaching the space through which the radiation beam from the encoder 40 passes.

In an embodiment, the support structure MT may have a much lower height (relative to the thickness of the patterning device MA) than illustrated in FIGS. 2, 6, 7, 11 and 12. This allows the facing surface 11 to be much closer to the patterning device MA. Being closer to the patterning device MA may significantly increases the heat transfer which is achievable. In an embodiment the facing surface 11 may come as close as 1 mm or less to the patterning device MA. Additionally, a support structure MT with a lower height makes any movement of the facing surface 11 towards or away from the patterning device MA more significant in terms of change in heat transfer. This is because the change in distance between the facing surface 11 and patterning device MA possible is a larger fraction of the absolute distance between the facing surface 11 and the patterning device MA than if the support structure MT has a greater height.

As will be appreciated, any of the above described features can be used with any other feature and it is not only those combinations explicitly described which are covered in this application.

In an aspect, there is provided a lithographic apparatus comprising a support structure configured to support a patterning device, the patterning device serving to pattern a radiation beam according to a desired pattern and having a planar main surface through which the radiation beam passes; a position measurement device configured to measure a position of the support structure relative to a projection system, the position measurement device comprising an electromagnetic radiation measurement system; an outlet opening configured to provide a gas flow into the area of the patterning device, a final element of an illumination system and a first element of the projection system; and an inlet opening configured to extract the gas which has exited the outlet opening, wherein the inlet opening is positioned radially inwardly of the electromagnetic radiation measurement system and radially outward of the outlet opening, relative to an optical axis of the apparatus, the optical axis being substantially perpendicular to the planar main surface, to prevent the gas from the outlet opening reaching a space through which electromagnetic radiation used to measure in the electromagnetic radiation measurement system passes.

In an embodiment, the outlet opening directs the gas flow at the patterning device.

In an embodiment, the outlet opening is in a facing surface opposite the planar main surface of the patterning device.

In an embodiment, the outlet opening is configured such that a flow of the gas which has left the outlet opening flows past the patterning device in a direction radially outward relative to the optical axis of the apparatus.

In an embodiment, the lithographic apparatus further comprises a controller configured to control the gas flow out of the outlet opening and into the inlet opening so as to create an over pressure into the area of the patterning device, the final element of the illumination system and the first element of the projection system.

In an embodiment, the outlet opening, inlet opening and controller are configured to ensure that the gas flow rates are such that gas flow at the patterning device has a Reynolds number greater than or equal to 2000.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components. Throughout the description, reference has been made to a stepping direction and a scanning direction. The scanning and stepping direction as referred to in the description are principal orthogonal axes. While in a preferred embodiment, these principal axes may be aligned with the scanning and stepping directions, in other embodiments they may be independent of the scanning and stepping directions.

While specific embodiments of the invention have been described above, it will be appreciated that the invention may be practiced otherwise than as described. The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any dry lithography apparatus. One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a liquid handling structure) or an outlet out of the immersion space (or an inlet into the liquid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A thermal conditioning system configured to thermally condition a patterning device supported by a support structure of a lithographic apparatus, the patterning device serving to pattern a radiation beam from an illumination system of the lithographic apparatus and having a generally planar main surface through which the radiation beam passes toward a projection system of the lithographic apparatus, the thermal conditioning system comprising:
 a first outlet opening configured to create a first flow of gas in a first space located between the illumination system and the patterning device, the first outlet opening configured to direct the first flow of gas from opposite sides of a path of the radiation beam through the first space toward the path of the radiation beam through the first space;
 a second outlet opening configured to create a second flow of gas in a second space located between the patterning device and the projection system, the second outlet opening configured to direct the second flow of gas from opposite sides of a path of the radiation beam through the second space toward the path of the radiation beam through the second space;
 a temperature conditioning unit configured to thermally condition the first flow of gas and the second flow of gas prior to being provided to the first outlet opening and the second outlet opening, respectively;
 a first inlet opening configured to extract gas leaking from the first space to a surrounding environment above the support structure; and
 a second inlet opening configured to extract gas leaking from the second space to a surrounding environment below the support structure,
 wherein the first flow of gas and the second flow of gas have respectively a horizontal directional component substantially parallel to the generally planar main surface of the patterning device when the support structure supports the patterning device, and
 wherein the second outlet opening is configured such that, at a point in time, an imaginary line coaxial with the second outlet opening is non-parallel with the generally planar main surface of the patterning device when the support structure supports the patterning device.

2. The thermal conditioning system of claim 1, wherein the second inlet opening is located in a flow path between the second space and an output of an encoder measurement beam to measure a position of the support structure.

3. The thermal conditioning system of claim 1, further comprising a baffle for an end of the support structure to separate the first and second spaces.

4. The thermal conditioning system of claim 1, further comprising a controller configured to control the flow rate of the first flow of gas and/or of the second flow of gas.

5. The thermal conditioning system of claim 4, wherein the controller is configured to control the temperature conditioning unit.

6. The thermal conditioning system of claim 5, wherein the controller is configured to control the temperature conditioning unit based on one or more selected from: a measured temperature of the patterning device, an exposure dose and/or patterning device transmission.

7. The thermal conditioning system of claim 1, wherein the temperature conditioning unit includes a heating element and/or a cooling element.

8. The thermal conditioning system of claim 1, wherein the second flow of gas is turbulent or laminar.

9. The thermal conditioning system of claim 1, wherein the first inlet opening is provided distant from the first outlet opening and positioned away from an optical axis and/or wherein the second inlet opening is provided distant from the second outlet opening and positioned away from the optical axis.

10. The thermal conditioning system of claim 1, further comprising a recycling system configured to recycle gas extracted by the first inlet opening and/or by the second inlet opening.

11. A lithographic apparatus comprising:
 an illumination system configured to provide radiation;
 a support structure configured to support a patterning device, the support structure arranged to receive radiation from the illumination system;
 a projection system configured to receive radiation from the support structure and project the radiation onto a substrate; and
 the thermal conditioning system of claim 1.

12. A device manufacturing method, comprising:
providing a radiation beam from an illumination system optical element;
patterning the radiation beam with a patterning device supported on a movable support structure, the patterning device having a generally planar main surface through which the radiation beam passes;
projecting the patterned radiation beam toward a substrate via a projection system optical element;
directing a first flow of gas from a first outlet opening in a first space located between the illumination system optical element and the patterning device, the first outlet opening directing the first flow of gas from opposite sides of a path of the radiation beam through the first space toward the path of the radiation beam through the first space;
directing a second flow of gas from a second outlet opening to form a gas barrier in a second space located between the patterning device and the projection system optical element, the second outlet opening directing the second flow of gas from opposite sides of a path of the radiation beam through the second space toward the path of the radiation beam through the second space;
thermally conditioning the first flow of gas and the second flow of gas prior to being provided to the first outlet opening and the second outlet opening, respectively;
extracting gas leaking from the first space to a surrounding environment above the support structure using a first inlet opening; and
extracting gas leaking from the second space to a surrounding environment below the support structure using a second inlet opening,
wherein the first flow of gas and the second flow of gas have respectively a horizontal directional component substantially parallel to the generally planar main surface of the patterning device when the support structure supports the patterning device, and
wherein the second outlet opening is configured such that, at a point in time, an imaginary line coaxial with the second outlet opening is non-parallel with the generally planar main surface of the patterning device when the support structure supports the patterning device.

13. A thermal conditioning system configured to thermally condition a patterning device supported by a support structure of a lithographic apparatus, the patterning device serving to pattern a radiation beam from an illumination system optical element of the lithographic apparatus and having a generally planar main surface through which the radiation beam passes toward a projection system optical element of the lithographic apparatus, the thermal conditioning system comprising:
an opening configured to provide gas on opposite sides of a radiation beam path through a space located between the illumination system optical element and the patterning device when the support structure supports the patterning device and to direct a flow of gas from the opposite sides generally perpendicularly to, and toward, the radiation beam path;
a first structure comprising a first generally planar surface substantially parallel to the generally planar main surface of the patterning device when the support structure supports the patterning device, the first surface having a first aperture having a first width in a direction and the first aperture arranged to pass the radiation beam from the illumination system optical element toward the patterning device; and
a second structure comprising a second generally planar surface substantially parallel to the generally planar main surface of the patterning device when the support structure supports the patterning device, the second surface having a second aperture having a second width in the direction and the second aperture arranged to pass the patterned radiation beam from the patterning device toward the projection system optical element, wherein a main body of the support structure is configured to be located between, and movable with respect to, the first and second surfaces that are each wider than the main body of the support structure,
wherein the first width is larger than the second width and both the first and second widths are smaller than a width of the patterning device in the direction.

14. The thermal conditioning system of claim 13, comprising a further opening configured to direct a flow of gas in the space, wherein the further opening is configured to provide gas on opposite sides of a radiation beam path through the space and to direct a flow of gas from the opposite sides, at a point in time, at an angle intersecting the patterning device.

15. The thermal conditioning system of claim 13, further comprising an inlet opening configured to exhaust gas, the inlet opening located in a flow path between an output of an encoder measurement beam to measure a position of the support structure and a space located between the patterning device and the projection system optical element.

16. The thermal conditioning system of claim 13, comprising a further opening configured to provide a flow of gas to a space located between the patterning device and the projection system optical element, the space between the patterning device and the projection system optical element at least partly defined by a generally horizontal structure between the projection system optical element and the support structure and by a structure extending downwardly from the horizontal structure.

17. The thermal conditioning system of claim 13, comprising a further opening configured to direct a flow of gas in the space, the further opening configured such that, at a point in time, an imaginary line coaxial with the further opening intersects at an angle the generally planar main surface of the patterning device when the support structure supports the patterning device.

18. The thermal conditioning system of claim 17, wherein the angle is substantially perpendicular to the generally planar main surface.

19. The thermal conditioning system of claim 13, wherein the direction is a scanning direction of the support structure during formation of the patterned radiation beam.

20. A lithographic apparatus comprising:
an illumination system configured to provide radiation;
a support structure configured to support a patterning device, the support structure arranged to receive radiation from the illumination system;
a projection system configured to receive radiation from the support structure and project the radiation onto a substrate; and
the thermal conditioning system of claim 13.

* * * * *

UNITED STATES PATENT AND TRADEMARK OFFICE
CERTIFICATE OF CORRECTION

PATENT NO. : 10,788,763 B2
APPLICATION NO. : 15/354821
DATED : September 29, 2020
INVENTOR(S) : Jan Steven Christiaan Westerlaken et al.

Page 1 of 1

It is certified that error appears in the above-identified patent and that said Letters Patent is hereby corrected as shown below:

On the Title Page

On page 2, item (56) References Cited Foreign Patent Documents:
Please correct "JP 2001-168027, 08/2001" to "JP 2001-168027, 06/2001" and
Add:
-- JP 2002-260998, 09/2002
JP 2001-168027, 06/2001
JP 2002-260998, 09/2002 --

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*